(12) United States Patent
Chang et al.

(10) Patent No.: US 10,431,687 B2
(45) Date of Patent: Oct. 1, 2019

(54) STRUCTURE AND FORMATION METHOD OF SEMICONDUCTOR DEVICE STRUCTURE

(71) Applicant: Taiwan Semiconductor Manufacturing Co., Ltd., Hsinchu (TW)

(72) Inventors: Che-Cheng Chang, New Taipei (TW); Chih-Han Lin, Hsinchu (TW)

(73) Assignee: TAIWAN SEMICONDUCTOR MANUFACTURING CO., LTD., Hsin-Chu (TW)

(*) Notice: Subject to any disclaimer, the term of this patent is extended or adjusted under 35 U.S.C. 154(b) by 0 days.

(21) Appl. No.: 15/687,723

(22) Filed: Aug. 28, 2017

(65) Prior Publication Data

US 2017/0358681 A1    Dec. 14, 2017

Related U.S. Application Data

(62) Division of application No. 14/813,799, filed on Jul. 30, 2015, now Pat. No. 9,748,394.

(60) Provisional application No. 62/164,223, filed on May 20, 2015.

(51) Int. Cl.
| | | |
|---|---|---|
| *H01L 29/78* | (2006.01) | |
| *H01L 29/66* | (2006.01) | |
| *H01L 29/49* | (2006.01) | |
| *H01L 29/423* | (2006.01) | |
| *H01L 21/3213* | (2006.01) | |

(52) U.S. Cl.
CPC .... *H01L 29/7856* (2013.01); *H01L 21/32133* (2013.01); *H01L 21/32136* (2013.01); *H01L 21/32137* (2013.01); *H01L 29/42376* (2013.01); *H01L 29/4916* (2013.01); *H01L 29/4958* (2013.01); *H01L 29/4966* (2013.01); *H01L 29/66545* (2013.01); *H01L 29/66795* (2013.01); *H01L 29/7848* (2013.01)

(58) Field of Classification Search
None
See application file for complete search history.

(56) References Cited

U.S. PATENT DOCUMENTS

| | | | |
|---|---|---|---|
| 6,833,588 B2 | 12/2004 | Yu et al. | |
| 6,844,238 B2 | 1/2005 | Yeo et al. | |
| 7,071,064 B2 | 7/2006 | Doyle et al. | |
| 7,282,766 B2 | 10/2007 | Okuno et al. | |
| 7,316,968 B2 | 1/2008 | Lee et al. | |
| 7,423,324 B2 | 9/2008 | Sekigawa et al. | |
| 7,514,346 B2 | 4/2009 | Chau et al. | |

(Continued)

FOREIGN PATENT DOCUMENTS

| | | |
|---|---|---|
| DE | 1020090257271 | 6/2010 |
| JP | 2013-197596 | 9/2013 |

(Continued)

*Primary Examiner* — Erik T. K. Peterson
(74) *Attorney, Agent, or Firm* — Haynes and Boone, LLP

(57) ABSTRACT

Structures and formation methods of a semiconductor device structure are provided. The semiconductor device structure includes a fin structure over a semiconductor substrate. The semiconductor device structure also includes a gate stack covering a portion of the fin structure. The gate stack includes a first portion and a second portion adjacent to the fin structure, and the first portion is wider than the second portion.

20 Claims, 9 Drawing Sheets

(56) References Cited

U.S. PATENT DOCUMENTS

| | | |
|---|---|---|
| 7,592,686 B2 | 9/2009 | Jang et al. |
| 8,716,786 B2 | 5/2014 | Baumbartner et al. |
| 8,871,575 B2 | 10/2014 | Wang et al. |
| 8,981,487 B2 | 3/2015 | Hung et al. |
| 9,018,054 B2 | 4/2015 | Yoshida et al. |
| 9,159,833 B2 | 10/2015 | Ching et al. |
| 9,245,882 B2 | 1/2016 | Ching et al. |
| 9,343,551 B2 | 5/2016 | Ching et al. |
| 9,362,285 B2 | 6/2016 | Basker et al. |
| 9,362,386 B2 | 6/2016 | Huang et al. |
| 9,391,205 B2 | 7/2016 | Chang et al. |
| 9,460,968 B2 | 10/2016 | Lin et al. |
| 9,698,058 B2 | 7/2017 | Ching et al. |
| 2006/0172497 A1* | 8/2006 | Hareland .......... H01L 29/42384 438/286 |
| 2009/0057761 A1* | 3/2009 | Kim ................ H01L 29/66795 257/344 |
| 2012/0199888 A1 | 8/2012 | Dai et al. |
| 2013/0026575 A1 | 1/2013 | Moroz et al. |
| 2013/0228876 A1* | 9/2013 | Mor ................ H01L 29/66545 257/401 |
| 2013/0249003 A1 | 9/2013 | Oh et al. |
| 2014/0001559 A1* | 1/2014 | Lin ................ H01L 29/66795 257/368 |
| 2014/0252486 A1* | 9/2014 | Lin ................ H01L 29/66795 257/365 |
| 2014/0264493 A1 | 9/2014 | Cheng et al. |
| 2015/0115363 A1* | 4/2015 | Chang ............. H01L 21/823431 257/347 |
| 2015/0228647 A1* | 8/2015 | Chang ............. H01L 21/823431 257/401 |
| 2015/0263128 A1* | 9/2015 | Basker ................ H01L 29/6681 257/288 |
| 2016/0056271 A1 | 2/2016 | Liaw |
| 2016/0087099 A1 | 3/2016 | Moroz et al. |
| 2016/0093537 A1* | 3/2016 | Chen ................ H01L 21/823431 438/283 |
| 2016/0099324 A1* | 4/2016 | Chang ............... H01L 21/28114 257/401 |
| 2016/0111531 A1* | 4/2016 | Dong .................... H01L 29/785 257/347 |
| 2016/0240650 A1* | 8/2016 | Chang .................. H01L 29/785 |
| 2016/0254385 A1* | 9/2016 | Wen .................... H01L 29/7856 257/401 |
| 2017/0330955 A1* | 11/2017 | Rahhal-Orabi .............................. H01L 21/28114 |

FOREIGN PATENT DOCUMENTS

| | | | |
|---|---|---|---|
| KR | 10-2005-0057663 | 6/2005 | |
| KR | 10-2014-0111577 | 9/2014 | |
| TW | 201438248 | 10/2014 | |
| WO | WO 2014/210264 | 12/2014 | |
| WO | WO 2016105348 A1 * | 6/2016 | ........ H01L 21/28114 |

\* cited by examiner

STRUCTURE AND FORMATION METHOD OF SEMICONDUCTOR DEVICE STRUCTURE

PRIORITY CLAIM AND CROSS-REFERENCE

The present application is a divisional application of U.S. patent application Ser. No. 14/813,799, filed Jul. 30, 2015, which claims the benefit of U.S. Provisional Application No. 62/164,223, filed on May 20, 2015, the entirety of each incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. For example, circuit designers look to novel structures to deliver improved performance, which has resulted in the development of three-dimensional designs, such as fin-like field effect transistors (FinFETs). The FinFET is fabricated with a thin vertical "fin" (or fin structure) extending up from a substrate. The channel of the FinFET is formed in this vertical fin. A gate is provided over the fin to allow the gate to control the channel from multiple sides. Advantages of the FinFET may include a reduction of the short channel effect, reduced leakage, and higher current flow.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
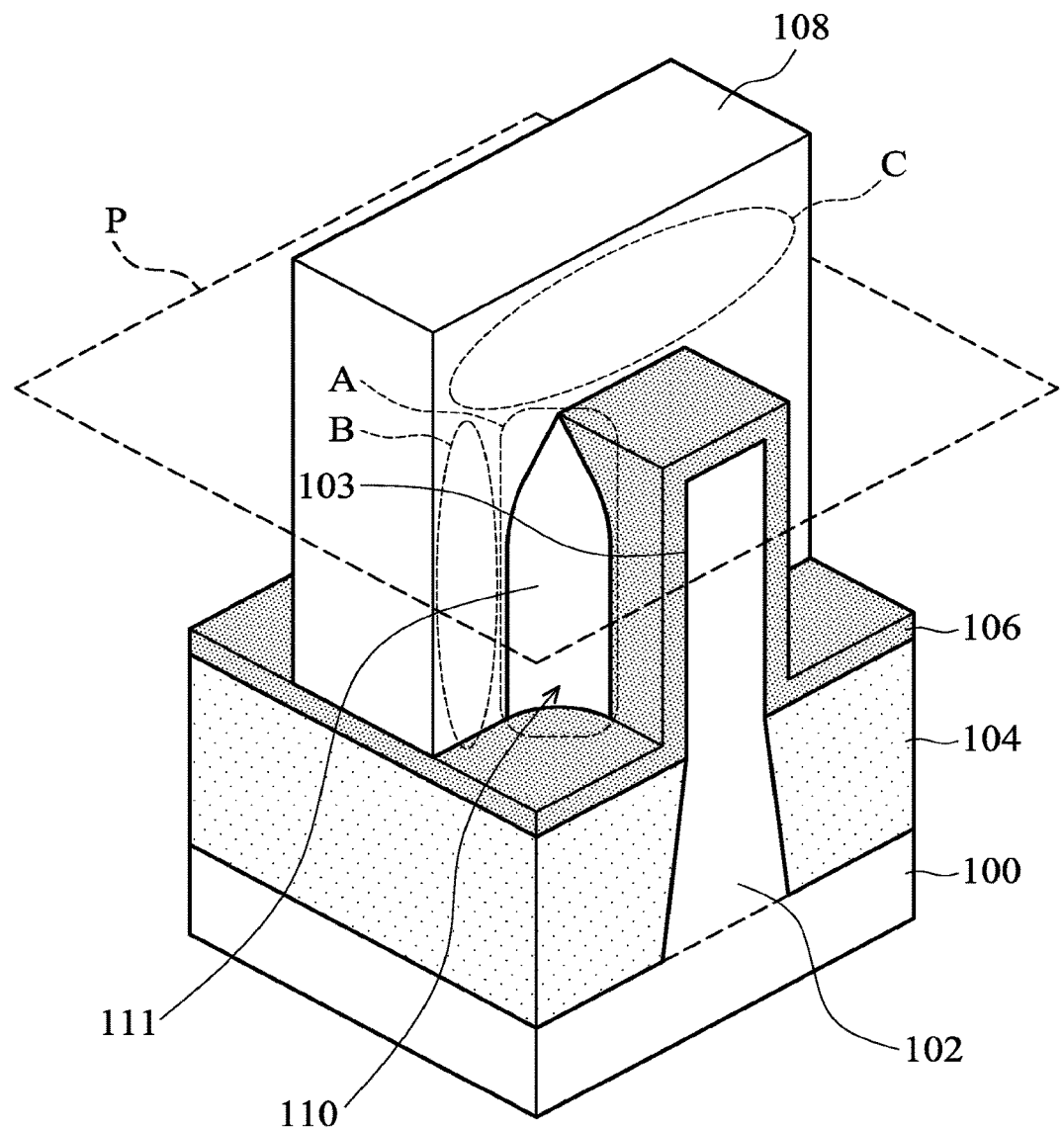
FIGS. 1A-1B are perspective views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
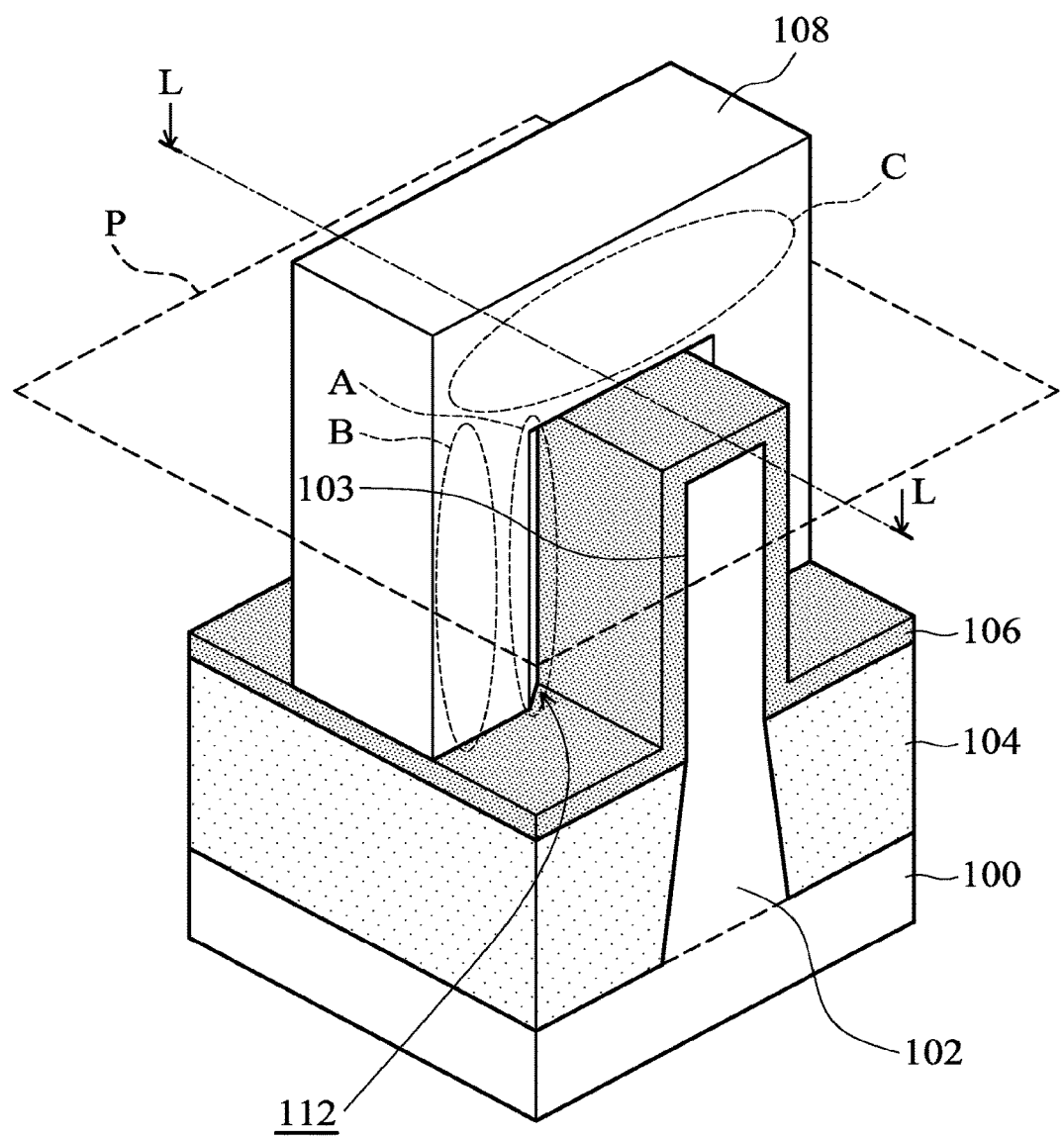

Some embodiments of the disclosure are described. FIGS. 1A-1B are perspective views of various stages of a process for forming a semiconductor device structure, in accordance with some embodiments. Additional operations can be provided before, during, and/or after the stages described in FIGS. 1A-1B. Some of the stages that are described can be replaced or eliminated for different embodiments. Additional features can be added to the semiconductor device structure. Some of the features described below can be replaced or eliminated for different embodiments.

As shown in FIG. 1A, a semiconductor substrate 100 is provided. In some embodiments, the semiconductor substrate 100 is a bulk semiconductor substrate, such as a semiconductor wafer. For example, the semiconductor substrate 100 is a silicon wafer. The semiconductor substrate 100 may include silicon or another elementary semiconductor material such as germanium. In some other embodiments, the semiconductor substrate 100 includes a compound semiconductor. The compound semiconductor may include gallium arsenide, silicon carbide, indium arsenide, indium phosphide, another suitable material, or a combination thereof.

In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

As shown in FIG. 1A, one or more fin structures are formed, in accordance with some embodiments. In some embodiments, multiple recesses (or trenches) are formed in the semiconductor substrate 100. As a result, multiple fin structures including a fin structure 102 are formed between the recesses. For simplicity, only one of the fin structures is shown. In some embodiments, one or more photolithography and etching processes are used to form the recesses.

As shown in FIG. 1A, isolation features 104 are formed in the recesses to surround a lower portion of the fin structure 102, in accordance with some embodiments. In some embodiments, the isolation features 104 continuously surround the lower portion of the fin structures 102. The isolation features 104 are used to define and electrically isolate various device elements formed in and/or over the semiconductor substrate 100. In some embodiments, the isolation features 104 include shallow trench isolation (STI) features, local oxidation of silicon (LOCOS) features, other suitable isolation features, or a combination thereof.

In some embodiments, each of the isolation features 104 has a multi-layer structure. In some embodiments, the isolation features 104 are made of a dielectric material. The dielectric material may include silicon oxide, silicon nitride, silicon oxynitride, fluoride-doped silicate glass (FSG), low-K dielectric material, another suitable material, or a combination thereof. In some embodiments, an STI liner (not shown) is formed to reduce crystalline defects at the interface between the semiconductor substrate 100 and the isolation features 104. The STI liner may also be used to reduce crystalline defects at the interface between the fin structures and the isolation features 104.

In some embodiments, a dielectric material layer is deposited over the semiconductor substrate 100. The dielectric material layer covers the fin structures including the fin structure 102 and fills the recesses between the fin structures. In some embodiments, the dielectric material layer is deposited using a chemical vapor deposition (CVD) process, a spin-on process, another applicable process, or a combination thereof. In some embodiments, a planarization process is performed to thin down the dielectric material layer. For example, the dielectric material layer is thinned until the fin structure 102 is exposed. The planarization process may include a chemical mechanical polishing (CMP) process, a grinding process, an etching process, another applicable process, or a combination thereof. Afterwards, the dielectric material layer is etched back to be below the top of the fin structure 102. As a result, the isolation features 104 are formed. The fin structures including the fin structure 102 protrude from top surfaces of the isolation features 104, as shown in FIG. 1A in accordance with some embodiments.

As shown in FIG. 1A, a gate dielectric layer 106 is deposited over the isolation features 104 and the fin structure 102, in accordance with some embodiments. In some embodiments, the gate dielectric layer 106 is made of silicon oxide, silicon nitride, silicon oxynitride, dielectric material with high dielectric constant (high-K), another suitable dielectric material, or a combination thereof. Examples of high-K dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the gate dielectric layer 106 is a dummy gate dielectric layer which will subsequently be removed. In some other embodiments, the gate dielectric layer 106 is not formed.

In some embodiments, the gate dielectric layer 106 is deposited using a chemical vapor deposition (CVD) process, an atomic layer deposition (ALD) process, a thermal oxidation process, a physical vapor deposition (PVD) process, another applicable process, or a combination thereof.

Afterwards, a gate electrode 108 is formed over the gate dielectric layer 106 to cover a portion of the fin structure 102, as shown in FIG. 1A in accordance with some embodiments. In some embodiments, the gate electrode 108 is a dummy gate electrode which will be replaced with a metal gate electrode. In some embodiments, the gate electrode 108 is made of polysilicon.

In some embodiments, a gate electrode layer is deposited over the gate dielectric layer 106. The gate electrode layer may be deposited using a CVD process or another applicable process. In some embodiments, the gate electrode layer is made of polysilicon. Afterwards, a patterned hard mask layer (not shown) is formed over the gate electrode layer, in accordance with some embodiments. The patterned hard mask layer is used to pattern the gate electrode layer into one or more gate electrodes including the gate electrode 108.

In some embodiments, the patterned hard mask layer includes a first hard mask layer and a second hard mask layer. The first hard mask layer is between the gate electrode layer and the second hard mask layer. In some embodiments, the first hard mask layer is made of silicon nitride. In some embodiments, the second hard mask layer is made of silicon oxide. In some embodiments, the first hard mask layer and the second hard mask layer are made of silicon nitride, silicon oxide, silicon carbide, metal nitrides such as titanium nitride and/or tantalum nitride, another suitable material, or a combination thereof. In some embodiments, the second hard mask layer is thicker than the first mask layer. One or more additional hard mask layers can be added to the patterned hard mask.

In some embodiments, an etching process is used to partially remove the gate electrode layer and form the gate electrodes including the gate electrode 108. In some embodiments, the etching process includes multiple etching operations. In some embodiments, the etching process includes a first etching operation, a second etching operation, and a third etching operation. In some embodiments, after the first etching operation, the gate electrode 108 having the profile shown in FIG. 1A is formed.

In some embodiments, the first etching operation is a plasma etching operation. In some embodiments, the etchant used in the first etching operation includes a gas mixture. In some embodiments, the gas mixture is excited to generate plasma for performing the first etching operation. In some embodiments, the gas mixture includes HBr, $Cl_2$, $CF_4$, $C_2F_6$, $C_2F_4$, Ar, He, $CH_4$, $O_2$, $N_2$, another similar gas, another suitable gas, or a combination thereof.

During the first etching operation, the composition of the gas mixture may be varied according to requirements. In some embodiments, the pressure used for performing the first etching operation is in a range from about 10 mtorrs to about 500 mtorrs. In some embodiments, the operation power used for performing the first etching operation is in a range from about 10 W to about 1500 W. In some embodiments, the operation temperature for performing the first etching operation is in a range from about 20 degrees C. to about 120 degrees C. In some embodiments, the operation time for performing the first etching operation is in a range from about 1 second to about 1000 seconds.

Figure 2A:
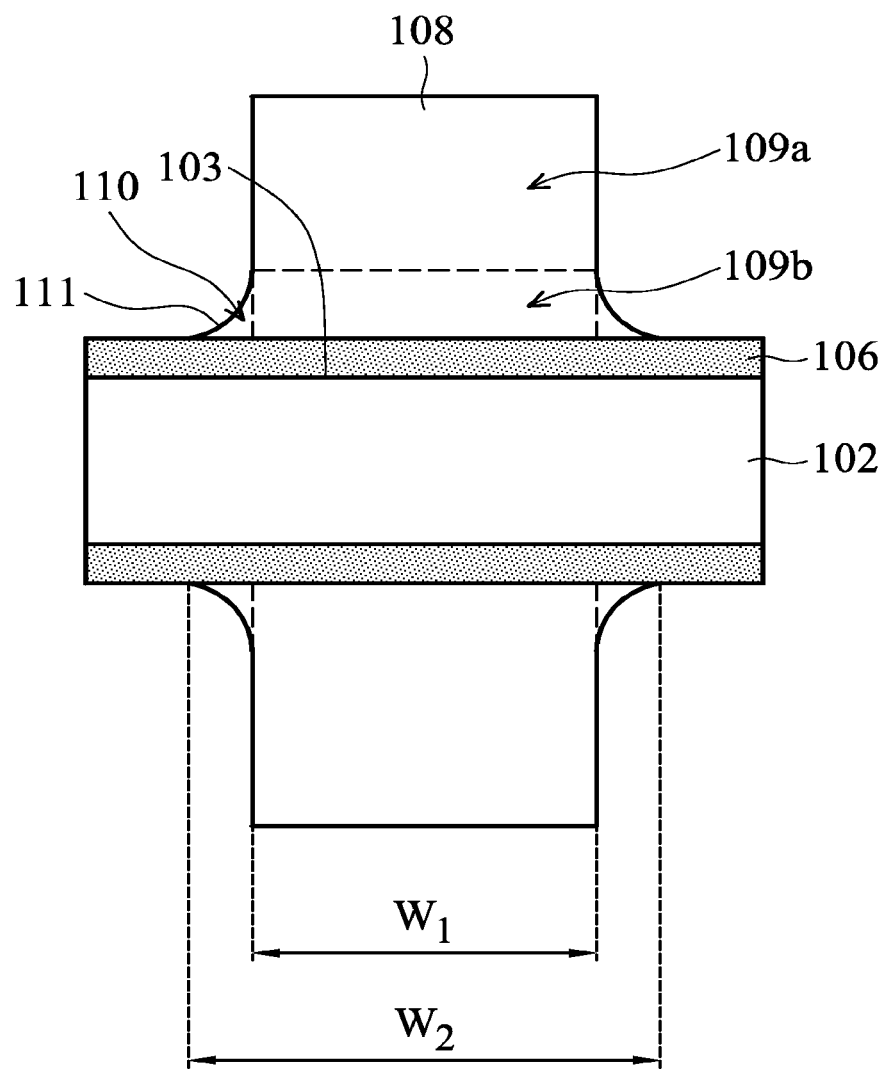
FIGS. 2A-2B are cross-sectional views of various stages of a process for forming a semiconductor device structure, in accordance with some embodiments.
Figure 2B:
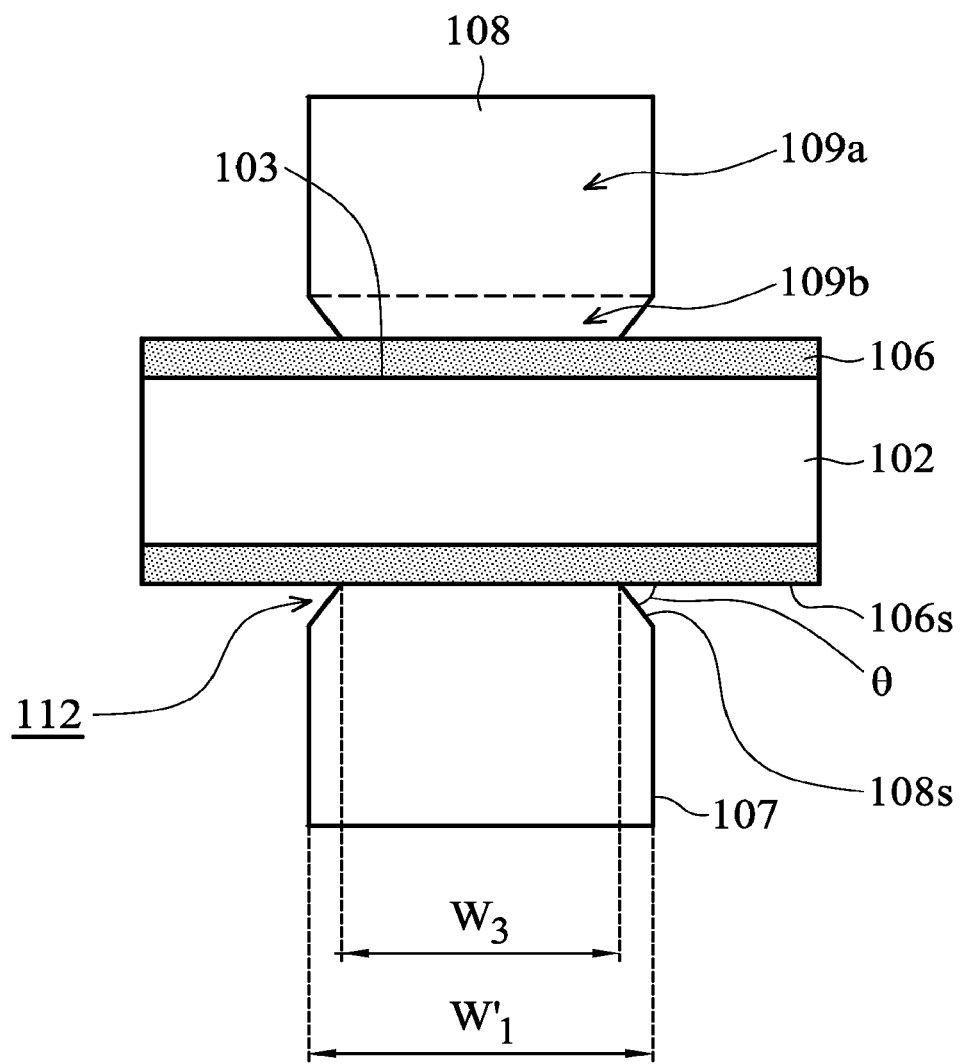

FIGS. 2A-2B are cross-sectional views of various stages of a process for forming a semiconductor device structure, in accordance with some embodiments. In some embodiments, FIG. 2A is a cross-sectional view of the structure shown in FIG. 1A. In some embodiments, the cross-sectional view is taken along an imaginary plane P. The imaginary plane P is parallel to a main surface of the semiconductor substrate 100 and intersects the fin structure 102 protruding above the isolation features 104.

As shown in FIG. 2A, the gate electrode 108 includes a first portion 109a and a second portion 109b. The second portion 109b is between the first portion 109a and the fin structure 102. In some embodiments, the second portion 109a is adjacent to the fin structure 102. In some embodiments, the second portion 109b is wider than the first portion 109a. In some embodiments, the first portion 109a and the second portion 109b are substantially as high as the fin structure 102.

As shown in FIGS. 1A and 2A, the second portion 109b of the gate electrode 108 includes a protrusion portion 110, in accordance with some embodiments. The protrusion portion 110 may be formed as a result of the first etching operation. In some embodiments, the protrusion portion 110 is in direct contact with a portion of the gate dielectric layer 106 that extends over a sidewall 103 of the fin structure 102, as shown in FIGS. 1A and 2A. In some other embodiments, the portion of gate dielectric layer 106 on the sidewalls of the fin structure 102 is removed. In these cases, the protrusion portion 110 is in direct contact with one of the sidewalls, such as the sidewall 103, of the fin structure 102.

As shown in FIG. 2A, the gate electrode 108 has a first width $W_1$ and a second width $W_2$. The second width $W_2$ is the width of the portion of the gate electrode 108 adjacent the fin structure 102 or to the gate dielectric layer 106 over the sidewall of the fin structure 102. In some embodiments, the width $W_2$ is greater than the width $W_1$. In some embodiments, the width $W_1$ is in a range from about 20 nm to about 45 nm. In some embodiments, the width $W_2$ is in a range from about 30 nm to about 60 nm. In some embodiments, widths of the first portion 109a are substantially the same. For example, each of the widths of the first portion 109a is equal to the width $W_1$.

In some embodiments, the protrusion portion 110 becomes wider along a direction towards the sidewall 103 of the fin structure 102. In some embodiments, the protrusion portion 110 gradually becomes wider along a direction towards the sidewall 103. As shown in FIGS. 1A and 2A, the protrusion portion 110 has a surface 111. In some embodiments, the surface 111 is a curved surface. In some embodiments, the center of curvature of the surface 111 is positioned outside of the gate electrode 108.

Afterwards, a second etching operation is performed to form a protection film (not shown) over the gate electrode 108, in accordance with some embodiments. In some embodiments, the protection film includes a polymer film. In some embodiments, the protection film is formed over a region A where the protrusion portion 110 of the gate electrode 108 is positioned. The protection film is also formed over regions B and C, as shown in FIG. 1A. In some embodiments, the thickness of the polymer film is not uniform. In some embodiments, the portion of the protection film that is formed over the region B is thicker than the portion of the protection film that is formed over the region A. In some embodiments, the portion of the protection film that is formed over the region C is thicker than the portion of the protection film that is formed over the region B.

In some embodiments, the second etching operation is performed in-situ in a process chamber where the first etching operation is performed. In some embodiments, the second etching operation is performed right after the first etching operation without taking the structure shown in FIG. 1A out of the process chamber. In some embodiments, a gas mixture is used in the second etching operation to form the protection film. In some embodiments, the gas mixture is excited to generate plasma for forming the protection film.

In some embodiments, the gas mixture includes $CH_4$, $O_2$, $CHF_3$, $CH_2F_2$, $CH_3F$, $N_2$, another similar gas, another suitable gas, or a combination thereof. During the second etching operation, the composition of the gas mixture may be varied according to requirements. In some embodiments, the pressure used for performing the second etching operation is in a range from about 10 mtorrs to about 100 mtorrs. In some embodiments, the operation power used for performing the second etching operation is in a range from about 10 W to about 500 W. In some embodiments, the operation temperature for performing the second etching operation is in a range from about 20 degrees C. to about 120 degrees C. In some embodiments, the operation time for performing the second etching operation is in a range from about 1 second to about 100 seconds.

Afterwards, a third etching operation (or a re-etch operation) is performed to partially remove the gate electrode 108, as shown in FIGS. 1B and 2B in accordance with some embodiments. In some embodiments, a fourth etching operation (or an over etch operation) is then performed. In some embodiments, after the third and fourth etching operations, recesses 112 are formed between the gate electrode 108 and the gate dielectric layer 106 over the sidewall of the fin structure 102, as shown in FIGS. 1B and 2B. In some embodiments, each of the recesses 112 extends from a sidewall 107 of the gate electrode 108 towards an inner portion of the gate electrode 108 and the sidewall 103 of the fin structure 102, as shown in FIGS. 1B and 2B.

In some embodiments, the third etching operation is performed in-situ in the same process chamber where the first etching operation and the second etching operation are performed. In some embodiments, the fourth etching operation is also performed in-situ in the same process chamber. In some embodiments, before the first, second, third, and fourth etching operations are finished, the structure shown in FIG. 1A is positioned in the process chamber without being moved out.

As mentioned above, the portion of the protection film over the region A or over the protrusion portion 110 of the gate electrode 108 is thinner than that over the region B or over the region C. As a result, after the third etching operation (and the fourth etching operation), a larger amount of the gate electrode 108 at the region A is removed than that at the region B or the region C since the protection film is thinner at the region A. Therefore, the protrusion portion 110 is removed, and the recesses 112 are formed.

In some embodiments, the third etching operation is a plasma etching operation. In some embodiments, the etchant used in the third etching operation includes a gas mixture. In some embodiments, the gas mixture is excited to generate plasma for performing the third etching operation. In some embodiments, the gas mixture includes HBr, $Cl_2$, $CF_4$, $C_2F_6$, $C_2F_4$, Ar, He, $CH_4$, $O_2$, $N_2$, another similar gas, another suitable gas, or a combination thereof. During the third etching operation, the composition of the gas mixture may be varied according to requirements. In some embodiments, the pressure used for performing the third etching operation is in a range from about 10 mtorrs to about 300 mtorrs. In some embodiments, the operation power used for performing the third etching operation is in a range from about 10 W to about 500 W. In some embodiments, the operation temperature for performing the third etching operation is in a range from about 20 degrees C. to about 100 degrees C. In some embodiments, the operation time for performing the third etching operation is in a range from about 1 second to about 300 seconds.

In some embodiments, the fourth etching operation is a plasma etching operation. In some embodiments, the etchant used in the fourth etching operation includes a gas mixture. In some embodiments, the gas mixture is excited to generate plasma for performing the fourth etching operation. In some embodiments, the gas mixture includes $CF_4$, $C_2F_6$, $C_2F_4$, $Cl_2$, $CHF_3$, $CH_2F_2$, $CH_3F$, Ar, He, $N_2$, $O_2$, another similar gas, another suitable gas, or a combination thereof. During the fourth etching operation, the composition of the gas mixture may be varied according to requirements. In some embodiments, the pressure used for performing the fourth etching operation is in a range from about 10 mtorrs to about 500 mtorrs. In some embodiments, the operation power used for performing the fourth etching operation is in a range from about 10 W to about 1400 W. In some embodiments, the operation temperature for performing the fourth etching operation is in a range from about 50 degrees C. to about 100 degrees C. In some embodiments, the operation time for performing the fourth etching operation is in a range from about 10 seconds to about 50 seconds.

After the etching operations, the gate electrode 108 is partially removed to form the recesses 112. As shown in FIG. 2B, due to the removal of the protrusion portions 110 and the formation of the recesses 112, the first portion 109a becomes wider than the second portion 109b, in accordance with some embodiments. In some embodiments, the second portion 109b gradually becomes narrower along a direction from the first portion 109a towards the sidewall 103 of the fin structure 102. In some embodiments, the second portion 109b is substantially as high as the fin structure 102, as shown in FIGS. 1B and 2B.

As shown in FIG. 2B, the gate electrode 108 has a third width $W_3$ after the recesses 112 are formed. The third width $W_3$ is the width of the portion of the gate electrode 108 adjacent to the gate dielectric layer 106 over the sidewall of the fin structure 102. In some other embodiments, the portion of the gate dielectric layer 106 over the sidewalls of the fin structure 102 is removed. In these cases, the width $W_3$ is the width of the portion of the gate electrode 108 adjacent to the sidewall of the fin structure 102. In some embodiments, after the etching operations, the first portion 109a has a width $W_1'$ that is smaller than the width $W_1$. In some embodiments, widths of the first portion 109a are substantially the same after the etching operations. For example, each of the widths of the first portion 109a is equal to the width $W_1'$.

In some embodiments, the width $W_1'$ is greater than the width $W_3$. In some embodiments, the width $W_1'$ is in a range from about 21 nm to about 43 nm. In some embodiments, the width $W_3$ is in a range from about 15 nm to about 40 nm. In some embodiments, the ratio of the width $W_3$ to the width $W_1'$ ($W_3/W_1'$) is in a range from about 0.6 to about 0.96. In some cases, if the ratio ($W_3/W_1'$) is smaller than about 0.6, the width $W_3$ may be too small. As a result, the metal gate stack 314 might not be able to control the channel region properly. In some other cases, if the ratio ($W_3/W_1'$) is greater than about 0.96, the width $W_3$ may be too large. As a result, the metal gate stack 314 may be too close to the source/drain features 304A and 304B, which may increase the risk of short circuiting.

As shown in FIG. 2B, there is an angle θ formed between a sidewall 108s of the recess 112 and a surface 106s of the gate dielectric layer 106 over the sidewall 103 of the fin structure 102. In some embodiments, the angle θ is smaller than about 90 degrees. In some embodiments, the angle θ is in a range from about 10 degrees to about 70 degrees. In some embodiments, the sidewall 108s is a substantially planar surface. In some embodiments, the sidewall 108s is a curved surface or includes a curved portion.

After the etching operations mentioned above, the gate electrode 108 may have the profile shown in FIGS. 1B and 2B, which may facilitate to subsequent processes. FIGS. 3A-3D are cross-sectional views of various stages of a process for a semiconductor device structure, in accordance with some embodiments. In some embodiments, FIGS. 3A-3D shows various stages of subsequent processes that are taken along the line L-L shown in FIG. 1B.

Figure 3A:
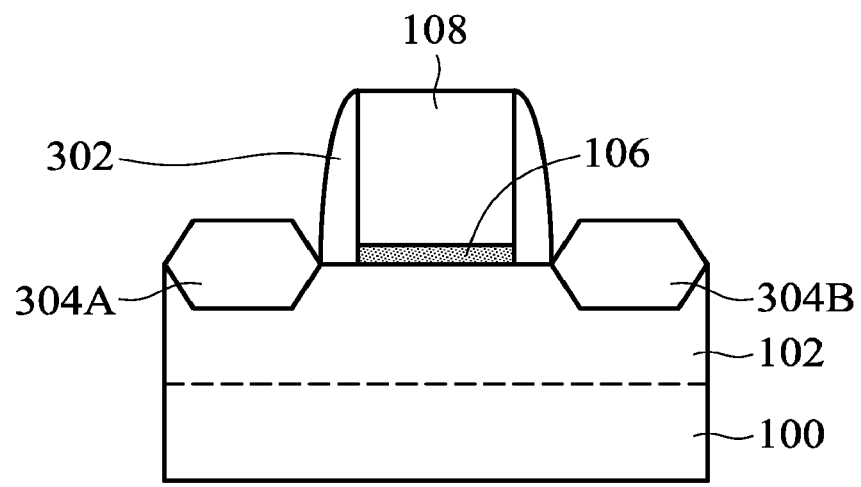
FIGS. 3A-3D are cross-sectional views of various stages of a process for a semiconductor device structure, in accordance with some embodiments.

As shown in FIG. 3A, spacer elements 302 are formed over sidewalls of the gate electrode 108, in accordance with some embodiments. The spacer elements 302 may be used to assist in a subsequent formation of source/drain features. In some embodiments, the spacer elements 302 include one or more layers. In some embodiments, the spacer elements 302 are made of a dielectric material. The dielectric material may include silicon oxide, silicon nitride, silicon oxynitride, another suitable material, or a combination thereof.

In some embodiments, a spacer material layer is deposited using a CVD process, a PVD process, a spin-on process, another applicable process, or a combination thereof. Afterwards, the spacer material layer is partially removed using an etching process, such as an anisotropic etching process. As a result, remaining portions of the spacer material layer form the spacer elements 302, as shown in FIG. 3A. In some embodiments, the spacer elements 302 are formed after the portion of the gate dielectric layer 106 not covered by the gate electrode 108 is removed. In some embodiments, the gate dielectric layer 106 not covered by the gate electrode 108 is removed together with the spacer material layer during the etching process for forming the spacer elements 302.

Afterwards, source/drain features 304A and 304B are formed on the fin structure 102 that are not covered by the gate electrode 108 and the spacer elements 302, as shown in FIG. 3A in accordance with some embodiments. In some embodiments, the fin structure 102 not covered by the gate electrode 108 and the spacer elements 302 is partially removed to form recesses using, for example an etching process. Afterwards, source/drain features 304A and 304B are formed in the recesses. In some embodiments, the source/drain features 304A and 304B are epitaxially grown features. In some embodiments, the source/drain features 304A and 304B protrude from the recesses. In some embodiments, the source/drain features 304A and 304B are formed using an epitaxial growth process. In some embodiments, the source/drain features 304A and 304B are also used as stressors that can apply strain or stress on the channel region between the source/drain features 304A and 304B. The carrier mobility may be improved accordingly.

Figure 3B:
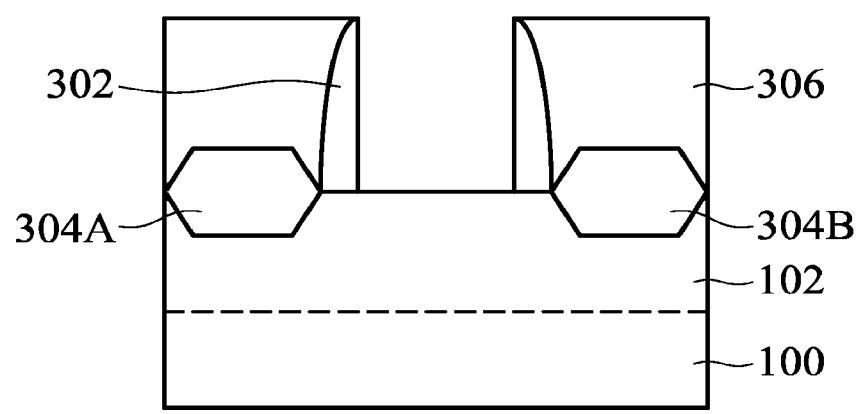

As shown in FIG. 3B, a dielectric layer 306 is formed to surround the gate stack 109, in accordance with some embodiments. In some embodiments, a dielectric material layer is deposited to cover the source/drain features 304A and 304B, the spacer elements 302, and the gate electrode 108. Afterwards, a planarization process is used to partially remove the dielectric material layer. The dielectric material layer may be partially removed until the gate electrode 108 is exposed. As a result, the dielectric layer 306 is formed.

In some embodiments, the dielectric material layer is made of silicon oxide, silicon oxynitride, borosilicate glass (BSG), phosphoric silicate glass (PSG), borophosphosilicate glass (BPSG), fluorinated silicate glass (FSG), low-k material, porous dielectric material, another suitable material, or a combination thereof. In some embodiments, the dielectric material layer is deposited using a CVD process, an ALD process, a spin-on process, another applicable process, or a combination thereof. In some embodiments, the planarization process includes a CMP process, a grinding process, an etching process, another applicable process, or a combination thereof.

Afterwards, the gate electrode 108 and the gate dielectric layer 106 are removed and replaced with a metal gate stack, in accordance with some embodiments. As shown in FIG.

3B, the gate electrode 108 and the gate dielectric layer 106 are removed to form recess 308 between the spacer elements 302, in accordance with some embodiments. The recess 308 exposes the fin structure 102. One or more etching processes may be used to form the recess 308.

Figure 3C:
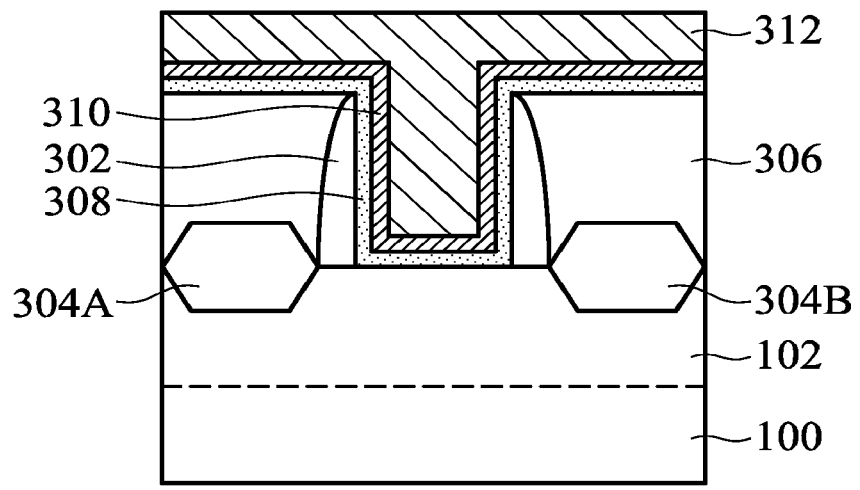

As shown in FIG. 3C, metal gate stack layers are deposited to fill the recess 308 (or trench) between the spacer elements 302, in accordance with some embodiments. The metal gate stack layers may include a gate dielectric layer 308, a work function layer 310, and a conductive filling layer 122. One or more other layers may be formed between the metal gate stack layers. For example, a barrier layer is formed between the gate dielectric layer 308 and the work function layer 310. A blocking layer may be formed between the work function layer 310 and the conductive filling layer 122.

In some embodiments, the gate dielectric layer 308 is made of a dielectric material with high dielectric constant (high-K). The gate dielectric layer 308 may be made of hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof.

The work function layer 310 is used to provide the desired work function for transistors to enhance device performance, such as improved threshold voltage. In some embodiments, the work function layer 310 is an n-type metal layer capable of providing a work function value suitable for the device, such as equal to or less than about 4.5 eV. In some embodiments, the work function layer 310 is a p-type metal layer capable of providing a work function value suitable for the device, such as equal to or greater than about 4.8 eV.

The n-type metal layer may include metal, metal carbide, metal nitride, or a combination thereof. For example, the n-type metal layer includes titanium nitride, tantalum, tantalum nitride, other suitable materials, or a combination thereof. The p-type metal layer may include metal, metal carbide, metal nitride, other suitable materials, or a combination thereof. For example, the p-type metal includes tantalum nitride, tungsten nitride, titanium, titanium nitride, other suitable materials, or a combination thereof.

The work function layer 310 may also be made of hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combination thereof. The thickness and/or the compositions of the work function layer 310 may be fine-tuned to adjust the work function level. For example, a titanium nitride layer may be used as a p-type metal layer or an n-type metal layer, depending on the thickness and/or the compositions of the titanium nitride layer.

In some embodiments, the conductive filling layer 122 is made of a metal material. The metal material may include tungsten, aluminum, copper, another suitable material, or a combination thereof. The formation of the metal gate stack layers may involve multiple deposition processes. The deposition processes may include a CVD process, an ALD process, a PVD process, an electroplating process, an electroless plating process, a spin-on process, another applicable process, or a combination thereof.

Figure 3D:
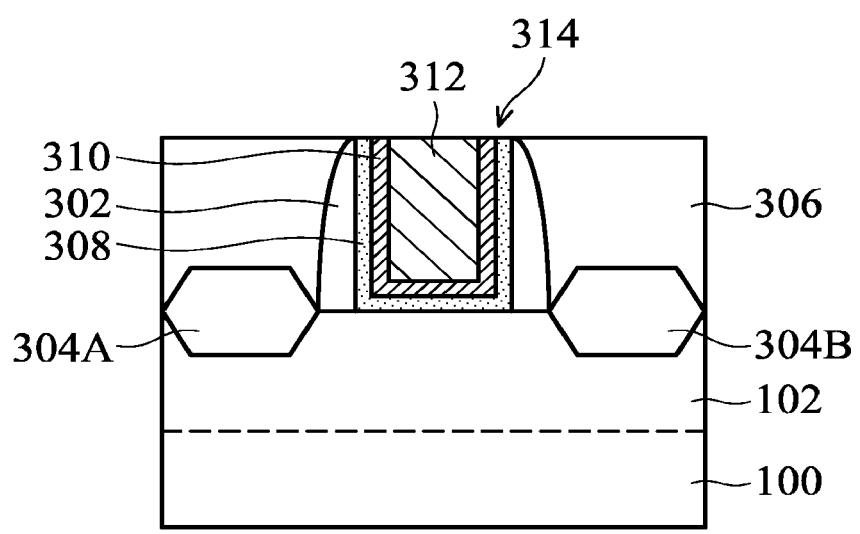

As shown in FIG. 3D, a planarization process is performed to remove the portions of the metal gate stack layers outside of the recess (or trench) between the spacer elements 302, in accordance with some embodiments. As a result, a metal gate stack 314 is formed. The metal gate stack 314 includes the gate dielectric layer 308, the work function layer 310, and a gate electrode 122' (such as a metal gate electrode) that is a portion of the conductive filling layer 312. In some embodiments, the metal gate stack 314 is in direct contact with the fin structure 102. For example, the gate dielectric layer 308 of the metal gate stack 314 is in direct contact with the fin structure 102.

Figure 4:
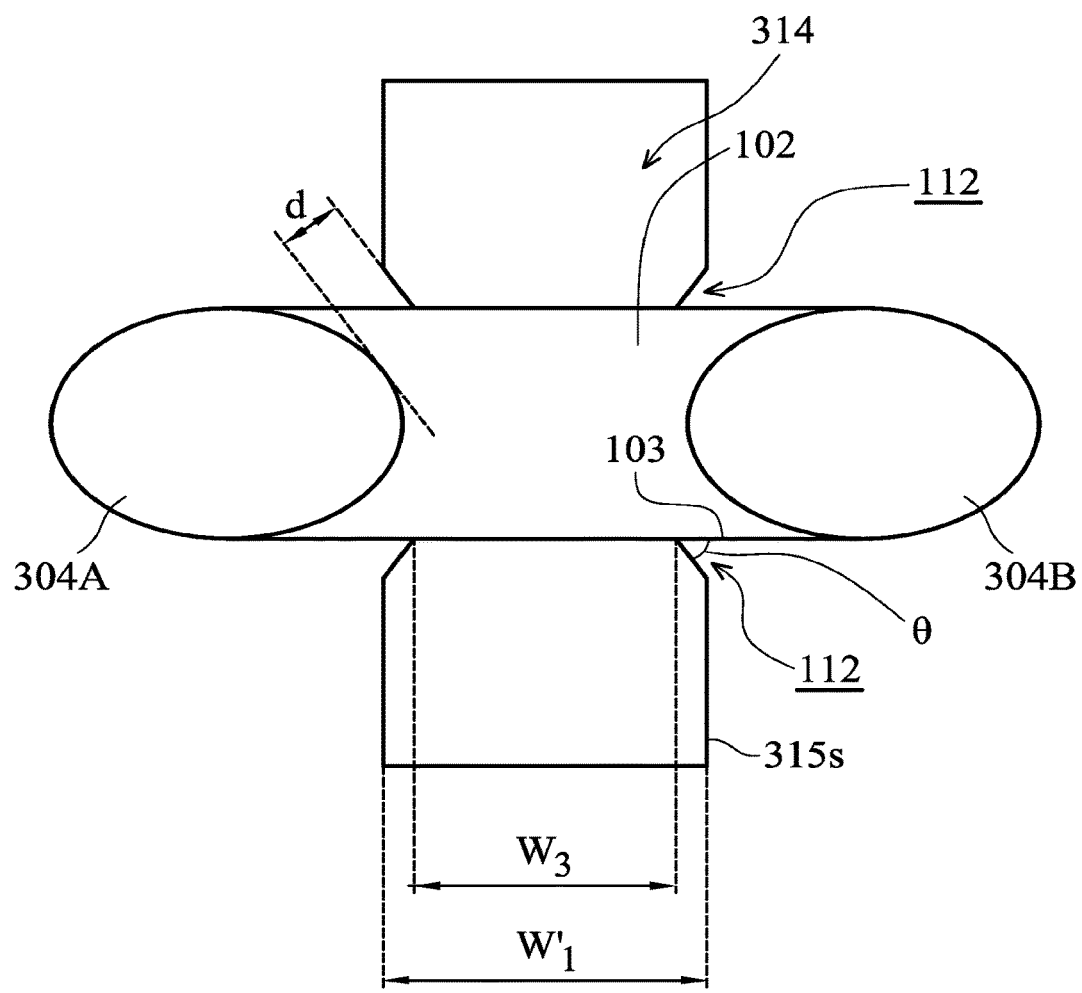
FIG. 4 is a cross-sectional view of a semiconductor device structure, in accordance with some embodiments.

FIG. 4 is a cross-sectional view of a semiconductor device structure, in accordance with some embodiments. In some embodiments, FIG. 4 is a cross-sectional of the structure shown in FIG. 3D, that is also taken along the imaginary plane P shown in FIG. 1B. For the sake of simplicity, some elements such as the dielectric layer 306 and the spacer elements 302 are not shown in FIG. 4.

As shown in FIG. 4, the metal gate stack 314 has a profile that is substantially the same as that of the gate electrode 108, in accordance with some embodiments. The metal gate stack 314 also includes the recesses 112. As shown in FIG. 4, each of the recesses 112 extends from a sidewall 315s of the metal gate stack 314 towards an inner portion of the metal gate stack 314 and the sidewall 103 of the fin structure 102. In some embodiments, each of the recesses 112 is adjacent to the sidewall of the fin structure 102. In some embodiments, each of the recesses 112 is positioned between the gate stack 314 and one of the source/drain features 304A and 304B. The metal gate stack 314 also has the width $W_3$ adjacent to the sidewall of the fin structure 102 and the width $W_1'$, as shown in FIG. 4. In some embodiments, the ratio of the width $W_3$ to the width $W_1'$ is in a range from about 0.6 to about 0.96, that is similar to that of the gate electrode 108 shown in FIG. 2B.

In some embodiments, the gate dielectric layer 106 is completely removed to facilitate the subsequent formation of the metal gate stack 314, as shown in FIG. 3B. In some embodiments, an over etch process is performed to ensure the complete removal of the gate dielectric layer 106. Due to the recesses 112, the gate electrode 108 is separated from the source/drain feature 304A or 304B by a distance. After the metal gate stack 314 is formed to replace the gate electrode 108 and the gate dielectric layer 106, the metal gate stack 314 is also separated from the source/drain feature 304A or 304B by a distance, such as the distance d. Therefore, a short circuiting between the metal gate stack 314 and the source/drain features 304A and/or 304B is prevented. The operation and the reliability of the semiconductor device structure are greatly improved.

Many variations and/or modifications can be made to embodiments of the disclosure. In some embodiments, the gate electrode 108 and the gate dielectric layer 106 are not replaced with the metal gate stack 314. In these cases, a short circuiting between the source/drain features 304A and/or 304B and the gate electrode 108 is still prevented due to the recesses 112 of the gate electrode 108.

Many variations and/or modifications can be made to embodiments of the disclosure. As mentioned above, the sidewall 108s of the gate electrode 108 is a curved surface or includes a curved portion. Therefore, the sidewall of the recess 112 of the metal gate stack 314 also includes a curved surface or a curved portion, in accordance with some embodiments.

Figure 5A:
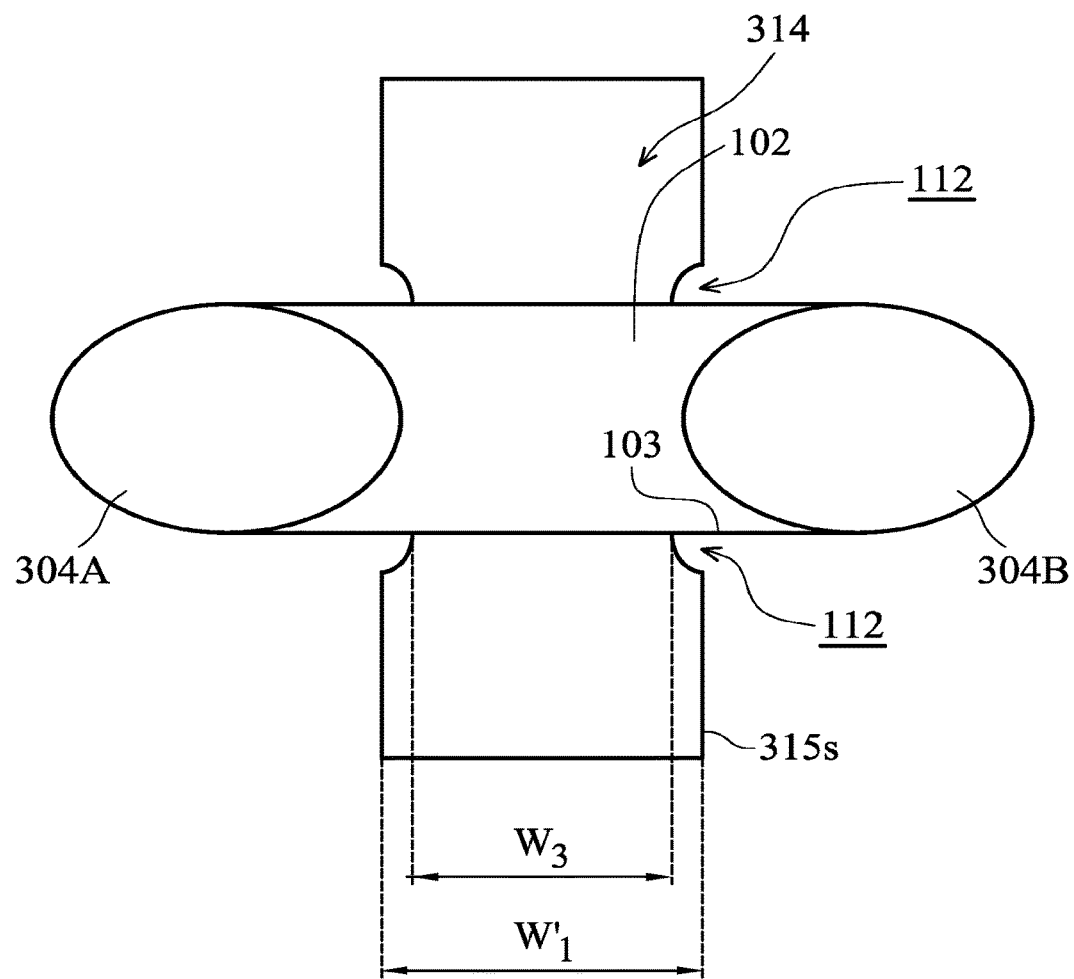
FIGS. 5A-5B are cross-sectional views of a semiconductor device structure, in accordance with some embodiments.
Figure 5B:
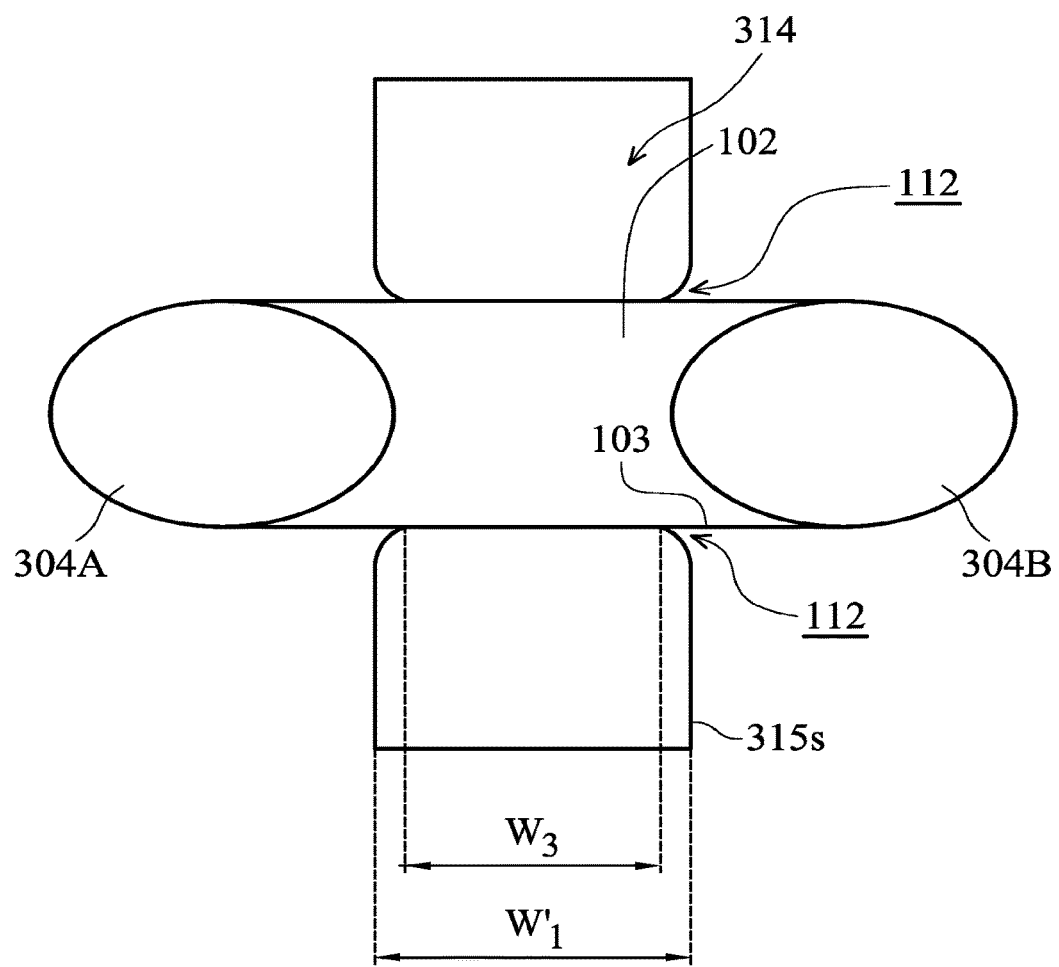

FIGS. 5A and 5B are cross-sectional views of a semiconductor device structure, in accordance with some embodiments. As shown in FIG. 5A, the recess 112 includes a curved profile, in accordance with some embodiments. The sidewall (or the bottom) of the recess 112 includes a curved surface. In some embodiments, the center of curvature of the curved surface is positioned outside of the metal gate stack 314, as shown in FIG. 5A. Many variations and/or modifications can be made to embodiments of the disclosure. In some other embodiments, the center of curvature of the curved surface is positioned within the metal gate stack 314, such as the structure shown in FIG. 5B.

Embodiments of the disclosure form a gate stack over a portion of a fin structure. By using multiple etching operations, the gate stack is formed to include a wider portion and a narrower portion adjacent to the fin structure. Because the gate stack becomes narrower near the fin structure, source/drain features formed on the fin structure are prevented from direct contact with the narrower portion of the gate stack. A short circuiting between the source/drain features and the gate stack is prevented. Therefore, the operation and the reliability of the semiconductor device structure are greatly improved.

In accordance with some embodiments, a semiconductor device structure is provided. The semiconductor device structure includes a fin structure over a semiconductor substrate. The semiconductor device structure also includes a gate stack covering a portion of the fin structure. The gate stack includes a first portion and a second portion adjacent to the fin structure, and the first portion is wider than the second portion.

In accordance with some embodiments, a semiconductor device structure is provided. The semiconductor device structure includes a fin structure over a semiconductor substrate. The semiconductor device structure also includes a gate stack covering a portion of the fin structure. The semiconductor device structure further includes a recess extending from a sidewall of the gate stack towards an inner portion of the gate stack and a sidewall of the fin structure.

In accordance with some embodiments, a method for forming a semiconductor device structure is provided. The method includes forming a fin structure over a semiconductor substrate. The method also includes forming a gate stack over the semiconductor substrate to cover a portion of the fin structure. The method further includes partially removing the gate stack such that the gate stack includes a first portion and a second portion adjacent to the fin structure, and the first portion is wider than the second portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   forming a fin structure over a semiconductor substrate;
   forming a gate stack over the semiconductor substrate to cover a portion of the fin structure;
   forming a protection layer over a first area of the gate stack and over a second area of the gate stack, the protection layer having a first thickness over the first area and a second thickness over the second area, the first thickness being greater than the second thickness; and
   after forming the protection layer over the first area of the gate stack and over the second area of the gate stack, partially removing the gate stack in the second area such that the gate stack includes a first portion and a second portion adjacent to the fin structure, and the first portion is wider than the second portion.

2. The method of claim 1, further comprising replacing the gate stack with a metal gate stack.

3. The method of claim 2, further comprising forming a source/drain feature on the fin structure before replacing the gate stack with the metal gate stack.

4. The method of claim 1, wherein the partial removal of the gate stack includes in-situ performing multiple etching operations in a process chamber.

5. The method of claim 4, wherein gas mixtures used in the multiple etching operations are different from each other.

6. The method of claim 1, wherein the partially removing the gate stack forms a recess extending from a sidewall of the gate stack towards an inner portion of the gate stack and a sidewall of the fin structure.

7. The method of claim 1, further comprising:
   epitaxially growing a feature on the fin structure adjacent the gate stack.

8. The method of claim 7, wherein the epitaxially growing the feature is performed prior to the partially removing the gate stack.

9. The method of in claim 7, wherein the partially removing the gate stack in the second area includes a first etching process of a plasma etch.

10. The method of claim 9, wherein the partially removing the gate stack in the second area includes a second etching process after the first etching process.

11. The method of claim 1, wherein the protection layer includes a polymer material.

12. The method of claim 1, wherein partially removing the gate stack in the second area such that the gate stack includes removing a larger amount of the gate stack in second area than the first area.

13. A method of fabricating a semiconductor device structure, the method comprising:
   providing a fin structure over a semiconductor substrate;
   depositing a gate electrode covering a portion of the fin structure;
   forming a protection layer over a first region of the gate electrode and over a second region of the gate electrode, the protection layer having a first thickness over the first region and a second thickness over the second region, the first thickness being less than the second thickness;
   after forming the protection layer, etching a recess in the gate electrode in the first region, wherein the recess extends from a sidewall of the gate electrode towards an inner portion of the gate electrode and a sidewall of the fin structure; and
   epitaxially growing a feature on the fin structure, wherein the recess is between the epitaxially grown feature and the gate electrode.

14. The method of claim 13, wherein the etching the recess includes:
   performing a first plasma etching process; and
   performing a second plasma etching process after the first plasma etching process.

15. The method of claim 13, wherein etching the recess in the gate electrode layer includes etching a larger amount of the gate electrode in the first region than the second region.

16. A method for forming a semiconductor device structure, comprising:

forming a fin structure over a semiconductor substrate;

forming a gate electrode over the semiconductor substrate to cover a portion of the fin structure, wherein the gate electrode includes a first portion and a second portion, the second portion nearer a sidewall of the fin structure, wherein the second portion has a width equal to or greater than the first portion;

forming a protection layer over the first portion of the gate electrode and over the second portion of the gate electrode, the protection layer having a first thickness over the first portion and a second thickness over the second portion, the first thickness being greater than the second thickness; and after forming the protection layer, plasma etching a recess in the gate electrode, wherein the plasma etching reduces the width of the second portion such that it is less than the first portion.

17. The method of claim 16, wherein the protection layer is a polymer.

18. The method of claim 16, further comprising forming a gate dielectric layer over the portion of the fin structure, and wherein forming the gate electrode over the semiconductor substrate to cover the portion of the fin structure includes forming the gate electrode over the gate dielectric layer.

19. The method of claim 18, wherein after plasma etching the recess in the gate electrode, the gate dielectric layer remains disposed over the portion of the fin structure.

20. The method of claim 16, further comprising:

forming sidewall spacers on opposite sides of the gate electrode after plasma etching the recess in the gate electrode;

removing the gate electrode such that a trench is formed between the sidewall spacers; and forming another gate electrode within the trench.

* * * * *